United States Patent
Woo (10) Patent No.: US 9,454,934 B2
(45) Date of Patent: Sep. 27, 2016

(54) STAGE CIRCUIT AND ORGANIC LIGHT EMITTING DISPLAY DEVICE USING THE SAME

(71) Applicant: SAMSUNG DISPLAY CO., LTD., Yongin, Gyeonggi-Do (KR)

(72) Inventor: Min-Kyu Woo, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 61 days.

(21) Appl. No.: 14/338,766

(22) Filed: Jul. 23, 2014

(65) Prior Publication Data

US 2015/0061982 A1 Mar. 5, 2015

(30) Foreign Application Priority Data

Aug. 29, 2013 (KR) .......................... 10-2013-0103041

(51) Int. Cl.
G11C 19/28 (2006.01)
G09G 3/3266 (2016.01)
G09G 3/32 (2016.01)

(52) U.S. Cl.
CPC ............. G09G 3/3266 (2013.01); G11C 19/28 (2013.01); G09G 2310/0281 (2013.01); G09G 2310/0286 (2013.01)

(58) Field of Classification Search
CPC ............. G09G 2310/0286; G09G 2310/0264; G09G 3/3266; G09G 3/3674–3/3681
See application file for complete search history.

(56) References Cited

U.S. PATENT DOCUMENTS

| | | | | |
|---|---|---|---|---|
| 7,256,775 B2* | 8/2007 | Eom | ..................... | G09G 3/3233 315/169.3 |
| 7,545,351 B2* | 6/2009 | Shin | ....................... | G09G 3/325 345/76 |
| 7,652,645 B2* | 1/2010 | Park | ..................... | G09G 3/3266 345/100 |
| 7,710,368 B2* | 5/2010 | Chung | ................. | G09G 3/3233 345/76 |
| 8,035,581 B2* | 10/2011 | Choi | ..................... | G09G 3/3266 345/76 |
| 8,125,422 B2* | 2/2012 | Choi | ..................... | G09G 3/3266 345/100 |
| 8,582,715 B2* | 11/2013 | Chung | ................. | H03K 17/687 327/108 |
| 8,599,117 B2* | 12/2013 | Jang | ..................... | G09G 3/3266 345/77 |
| 8,669,969 B2* | 3/2014 | Chung | ................. | G09G 3/3266 315/169.2 |
| 8,674,905 B2* | 3/2014 | Eom | ..................... | G09G 3/3233 345/76 |
| 8,717,257 B2* | 5/2014 | Kim | ...................... | G09G 3/3233 315/169.3 |
| 9,013,456 B2* | 4/2015 | Chung | ................. | G09G 3/3266 345/204 |
| 9,019,191 B2* | 4/2015 | Woo | ....................... | H05B 37/02 345/100 |

(Continued)

FOREIGN PATENT DOCUMENTS

| KR | 10-2010-0087871 | 8/2010 |
|---|---|---|
| KR | 10-2012-0028006 | 3/2012 |

(Continued)

*Primary Examiner* — Patrick F Marinelli
(74) *Attorney, Agent, or Firm* — Lee & Morse, P.C.

(57) ABSTRACT

A stage circuit includes first and second supply units. The first supply unit outputs a scan signal to a first output terminal. The second supply unit outputs an emission control signal to a second output terminal. The second supply unit includes a first transistor and a second transistor. The first transistor is between a first power source and the second output terminal, and has a gate electrode coupled to a first node. The second transistor is between the second output terminal and a second power source, and has a gate electrode coupled to a second node. Third and fourth transistors are coupled in series between the first power source and first node. A gate electrode of the third transistor is coupled to the third input terminal, and a gate electrode of the fourth transistor is coupled to the sixth input terminal.

20 Claims, 6 Drawing Sheets

(56) References Cited

U.S. PATENT DOCUMENTS

| | | | | |
|---|---|---|---|---|
| 9,129,562 B2* | 9/2015 | Jang | | G09G 3/3266 |
| 2003/0128180 A1* | 7/2003 | Kim | | G09G 3/3677 |
| | | | | 345/100 |
| 2005/0264493 A1* | 12/2005 | Shin | | G09G 3/325 |
| | | | | 345/76 |
| 2005/0285827 A1* | 12/2005 | Eom | | G09G 3/3233 |
| | | | | 345/76 |
| 2006/0022912 A1* | 2/2006 | Park | | G09G 3/3266 |
| | | | | 345/76 |
| 2006/0103323 A1* | 5/2006 | Eom | | G09G 3/3233 |
| | | | | 315/169.3 |
| 2006/0156121 A1* | 7/2006 | Chung | | G09G 3/3233 |
| | | | | 714/726 |
| 2006/0158394 A1* | 7/2006 | Choi | | G09G 3/3266 |
| | | | | 345/76 |
| 2006/0248421 A1* | 11/2006 | Choi | | G09G 3/3266 |
| | | | | 714/731 |
| 2007/0124633 A1* | 5/2007 | Kim | | G09G 3/2003 |
| | | | | 714/726 |
| 2007/0240024 A1* | 10/2007 | Shin | | G09G 3/325 |
| | | | | 714/726 |
| 2008/0062071 A1* | 3/2008 | Jeong | | G11C 19/184 |
| | | | | 345/46 |
| 2008/0062097 A1* | 3/2008 | Jeong | | G09G 3/3266 |
| | | | | 345/84 |
| 2008/0246698 A1* | 10/2008 | Eom | | G09G 3/3266 |
| | | | | 345/76 |
| 2010/0039423 A1* | 2/2010 | Jeong | | G09G 3/3266 |
| | | | | 345/213 |
| 2010/0188316 A1* | 7/2010 | Jang | | G09G 3/3266 |
| | | | | 345/76 |
| 2010/0188381 A1* | 7/2010 | Jang | | G09G 3/3266 |
| | | | | 345/211 |
| 2010/0283776 A1* | 11/2010 | Park | | G09G 3/3233 |
| | | | | 345/211 |
| 2012/0062525 A1* | 3/2012 | Kim | | G09G 3/3233 |
| | | | | 345/204 |
| 2012/0075259 A1* | 3/2012 | Chung | | G09G 3/3266 |
| | | | | 345/204 |
| 2012/0081409 A1* | 4/2012 | Chung | | G09G 3/3266 |
| | | | | 345/690 |
| 2012/0176417 A1* | 7/2012 | Jang | | G09G 3/3266 |
| | | | | 345/690 |
| 2012/0327131 A1* | 12/2012 | Jang | | G09G 3/3266 |
| | | | | 345/690 |
| 2013/0328495 A1* | 12/2013 | Woo | | H05B 37/02 |
| | | | | 315/224 |
| 2013/0342584 A1* | 12/2013 | Song | | G09G 3/3266 |
| | | | | 345/690 |
| 2014/0055444 A1* | 2/2014 | Jang | | G09G 3/3291 |
| | | | | 345/213 |
| 2014/0071114 A1* | 3/2014 | Kim | | G11C 19/28 |
| | | | | 345/212 |
| 2014/0078029 A1* | 3/2014 | Jang | | G09G 3/32 |
| | | | | 345/82 |
| 2014/0368414 A1* | 12/2014 | Kim | | G09G 3/3266 |
| | | | | 345/77 |
| 2014/0375616 A1* | 12/2014 | Kim | | G09G 3/3266 |
| | | | | 345/211 |
| 2015/0015554 A1* | 1/2015 | Kim | | G09G 3/3208 |
| | | | | 345/208 |
| 2015/0022428 A1* | 1/2015 | Liu | | G09G 3/3225 |
| | | | | 345/76 |
| 2015/0035733 A1* | 2/2015 | Woo | | G09G 3/3258 |
| | | | | 345/76 |
| 2015/0061982 A1* | 3/2015 | Woo | | G09G 3/3266 |
| | | | | 345/82 |
| 2015/0138180 A1* | 5/2015 | Park | | G09G 3/3233 |
| | | | | 345/212 |
| 2015/0170568 A1* | 6/2015 | Lee | | G11C 19/287 |
| | | | | 345/690 |
| 2015/0294619 A1* | 10/2015 | Lee | | G09G 3/3266 |
| | | | | 345/77 |

FOREIGN PATENT DOCUMENTS

| | | |
|---|---|---|
| KR | 10-2012-0080008 | 7/2012 |
| KR | 10-2013-0000020 | 1/2013 |
| KR | 10-2013-0143318 | 12/2013 |
| KR | 10-2014-0038148 | 3/2014 |

* cited by examiner

STAGE CIRCUIT AND ORGANIC LIGHT EMITTING DISPLAY DEVICE USING THE SAME

CROSS-REFERENCE TO RELATED APPLICATION

Korean Patent Application No. 10-2013-0103041, filed on Aug. 29, 2013, and entitled, "Stage Circuit and Organic Light Emitting Display Device Using The Same," is incorporated by reference herein in its entirety.

BACKGROUND

1. Field

One or more embodiments disclosed herein relate to a display device.

2. Description of the Related Art

Various types of flat panel displays have been developed. Examples include liquid crystal displays, organic light emitting displays, and plasma display panels. OLED displays generate based on a recombination of holes and electrons in an active layer. This types of displays are gaining increasing favor because of their fast response speed and low power consumption.

SUMMARY

In accordance with one embodiment a stage circuit includes a first supply unit coupled to first, second, and fifth input terminals, the first supply unit to output a scan signal to a first output terminal; and a second supply unit coupled to the first output terminal and third, fourth, and sixth input terminals, the second supply unit to output an emission control signal to a second output terminal. The second supply unit includes: a first transistor between a first power source and the second output terminal, the first transistor having a gate electrode coupled to a first node; a second transistor between the second output terminal and a second power source, the second transistor having a gate electrode coupled to a second node; and third and fourth transistors coupled in series between the first power source and the first node, wherein a gate electrode of the third transistor is coupled to the third input terminal and wherein a gate electrode of the fourth transistor is coupled to the sixth input terminal.

The first power source may be set to a gate-off voltage, and the second power source may be set to a gate-on voltage. First, second, third, and fourth clock signals may be respectively supplied to the first, second, third, and fourth input terminals, a first start signal or a scan signal of a previous stage may be supplied to the fifth input terminal, and a second start signal or an emission control signal of the previous stage may be supplied to the sixth input terminal.

The first and second clock signals may have substantially a same period, and voltages corresponding to low signals of the first and second clock signals may not overlap. The third and fourth clock signals may have substantially a same period, and voltages corresponding to low signals of the third and fourth clock signals may not overlap. The low signals of the first and fourth clock signals may overlap during at least part of a period. The low signals of the second and third clock signals may overlap during at least part of a period.

The second supply unit may include a first capacitor coupled between the second node and the fourth input terminal. The second supply unit may include a fifth transistor coupled between the third input terminal and the first node, the fifth transistor having a gate electrode coupled to the first output terminal; a sixth transistor coupled between the sixth input terminal and the second node, the sixth transistor having a gate electrode coupled to the third input terminal; a seventh transistor coupled between the first power source and the second node, the seventh transistor having a gate electrode coupled to the first node; and a second capacitor coupled between the first power source and the first node.

The first supply unit may include a fifth transistor coupled between the fifth input terminal and a third node, the first transistor having a gate electrode coupled to the first input terminal; a sixth transistor coupled between the first power source and the third node, the sixth transistor having a gate electrode coupled to the second input terminal; a seventh transistor coupled between the sixth transistor and the first power source, the seventh transistor having a gate electrode coupled to a fourth node; an eighth transistor coupled between the first power source and the first output terminal, the eighth transistor having a gate electrode coupled to the fourth node; a ninth transistor coupled between the first output terminal and the second input terminal, the ninth transistor having a gate electrode coupled to the third node; a tenth transistor coupled between the fourth node and the first input terminal, the tenth transistor having a gate electrode coupled to the third node; an eleventh transistor coupled between the fourth node and the second power source, the eleventh transistor having a gate electrode coupled to the first input terminal; a first capacitor coupled between the first output terminal and the third node; and a second capacitor coupled between the first power source and fourth node.

In accordance with another embodiment, an organic light emitting display device includes a plurality of pixels in an area defined by scan lines, data lines, and emission control lines; and a driver which include a number of stages to supply a scan signal to the scan lines and an emission control signal to the emission control lines, wherein each of the number of stages includes: a first supply unit coupled to first, second, and fifth input terminals, the first supply unit to output a scan signal to a first output terminal; and a second supply unit coupled to the first output terminal and third, fourth, and sixth input terminals, the second supply unit to output an emission control signal to a second output terminal.

The second supply unit includes a first transistor between a first power source and the second output terminal, the first transistor having a gate electrode coupled to a first node; a second transistor between the second output terminal and a second power source, the second transistor having a gate electrode coupled to a second node; and third and fourth transistors coupled in series between the first power source and the first node, wherein a gate electrode of the third transistor is coupled to the third input terminal and wherein a gate electrode of the fourth transistor is coupled to the sixth input terminal. The first power source may be set to a gate-off voltage, and the second power source may be set to a gate-on voltage.

First, second, third, and fourth clock signals may be respectively supplied to the first, second, third and fourth input terminals of an odd-numbered stage, and the second, first, fourth, and third clock signals may be respectively supplied to the first, second, third and fourth input terminals of an even-numbered stage. The first and second clock signals may have substantially a same period, and voltages corresponding to low signals of the first and second clock signals do not overlap.

The third and fourth clock signals may have substantially a same period, and voltages corresponding to low signals of the third and fourth clock signals may not overlap. The low signals of the first and fourth clock signals may overlap during at least part of a period. The low signals of the second and third clock signals may overlap during at least part of a period.

A first start signal set to a gate-on voltage or a scan signal of a previous stage may be supplied to the fifth input terminal, and a second start signal set to a gate-off voltage or an emission control signal of the previous stage may be supplied to the sixth input terminal. The first start signal or the scan signal of the previous stage, supplied to the fifth input terminal, may overlap the clock signal supplied to the first input terminal, and the second start signal or the emission control signal of the previous stage, supplied to the sixth input terminal, may overlap the clock signal supplied to the third input terminal one or more times.

The second supply unit may include a first transistor coupled between the third input terminal and the first node, the first transistor having a gate electrode coupled to the first output terminal; a second transistor coupled between the sixth input terminal and the second node, the second transistor having a gate electrode coupled to the third input terminal; a third transistor coupled between the first power source and the second node, the third transistor having a gate electrode coupled to the first node; a first capacitor coupled between the first power source and the first node; and a second capacitor coupled between the second node and the fourth input terminal.

The first supply unit may includes a fourth transistor coupled between the fifth input terminal and a third node, the fourth transistor having a gate electrode coupled to the first input terminal; a fifth transistor coupled between the first power source and the third node, the fifth transistor having a gate electrode coupled to the second input terminal; a sixth transistor coupled between the fifth transistor and the first power source, the sixth transistor having a gate electrode coupled to a fourth node; a seventh transistor coupled between the first power source and the first output terminal, the seventh transistor having a gate electrode coupled to the fourth node; an eighth transistor coupled between the first output terminal and the second input terminal, the eighth transistor having a gate electrode coupled to the third node; a ninth transistor coupled between the fourth node and the first input terminal, the ninth transistor having a gate electrode coupled to the third node; a tenth transistor coupled between the fourth node and the second power source, the tenth transistor having a gate electrode coupled to the first input terminal; a third capacitor coupled between the first output terminal and the third node; and a fourth capacitor coupled between the first power source and the fourth node.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
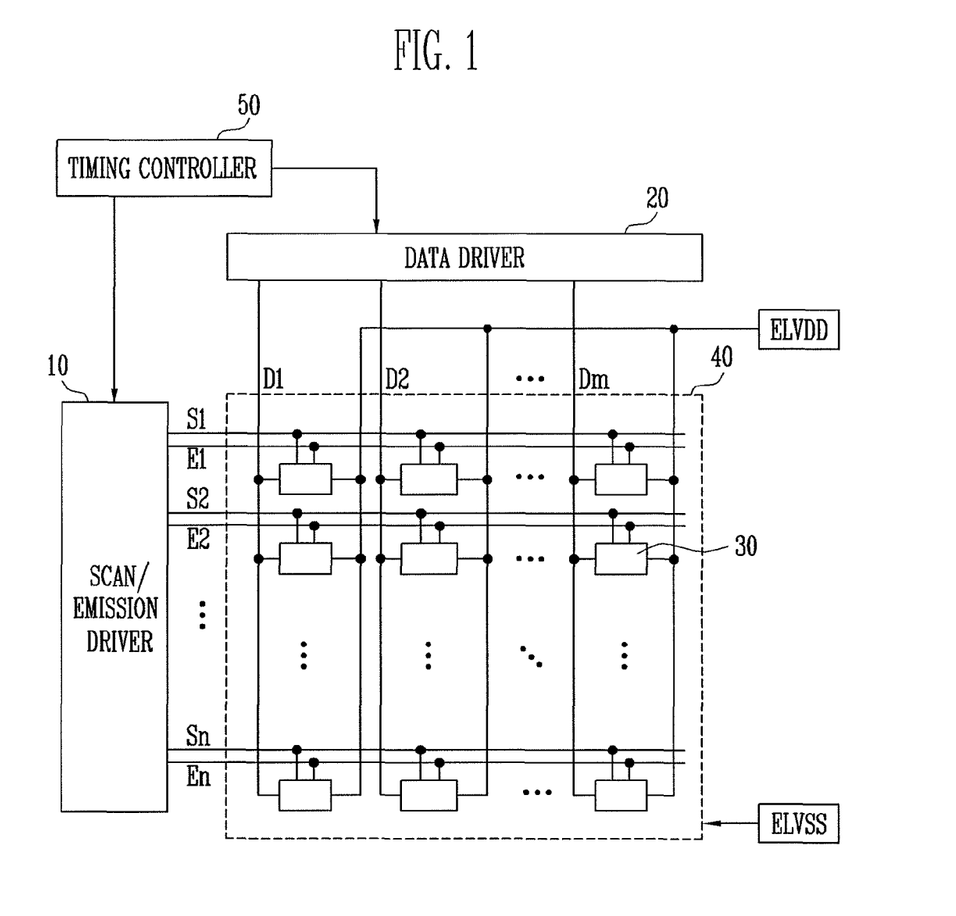
FIG. 1 illustrates an embodiment of an organic light emitting display device.

FIG. 1 illustrates an embodiment of an organic light emitting display device which includes a pixel unit 40 having pixels 30 in an area defined by scan lines S1 to Sn, emission control lines E1 to En, and data lines D1 to Dm. The display device also includes a scan/emission driver 10 to drive scan lines S1 to Sn and emission control lines E1 to En, a data driver 20 to drive data lines D1 to Dm, and a timing controller 50 to control the scan/emission driver 10 and data driver 20.

The scan/emission driver 10 progressively supplies a scan signal to scan lines S1 to Sn, and progressively supplies an emission control signal to emission control lines E1 to En. The scan/emission driver 10 may supply the scan signal and emission control signal in various forms, for example, based on the structure of pixels 30. In one embodiment, scan/emission driver 10 supplies an emission control signal to an i-th emission control line E1 to overlap the scan signal supplied to an i-th scan line S1 during at least a portion of a predetermined period. The scan/emission driver 10 includes a plurality of stages, with each stage is coupled to a respective pair of scan and emission control lines.

The scan signal may be set to a voltage (e.g., a gate-on voltage, which, for example, may be a low voltage) which turns on one or more transistors in pixels 30. The emission control signal may be set to a voltage (e.g., a gate-off voltage, which, for example, may be a high voltage) to turn off one or more transistors in pixels 30.

The data driver 20 supplies a data signal to data lines D1 to Dm synchronized with the scan signal. The data signal is supplied to pixels 30 selected by the scan signal. Accordingly, each selected pixel 30 charges a voltage corresponding to the data signal.

The timing controller 50 supplies a control signal to control the scan/emission driver 10 and data driver 20. The timing controller 50 supplies, to the data driver 20, data from an external source.

Each pixel 30 stores a voltage corresponding to the data signal. When current corresponding to the stored voltage passes through an organic light emitting diode (OLED), the OLED emits light with a luminance based on the amount of current. Pixels 30 may have different structures, for example, which operate based on the scan signal and emission control signals.

Figure 2:
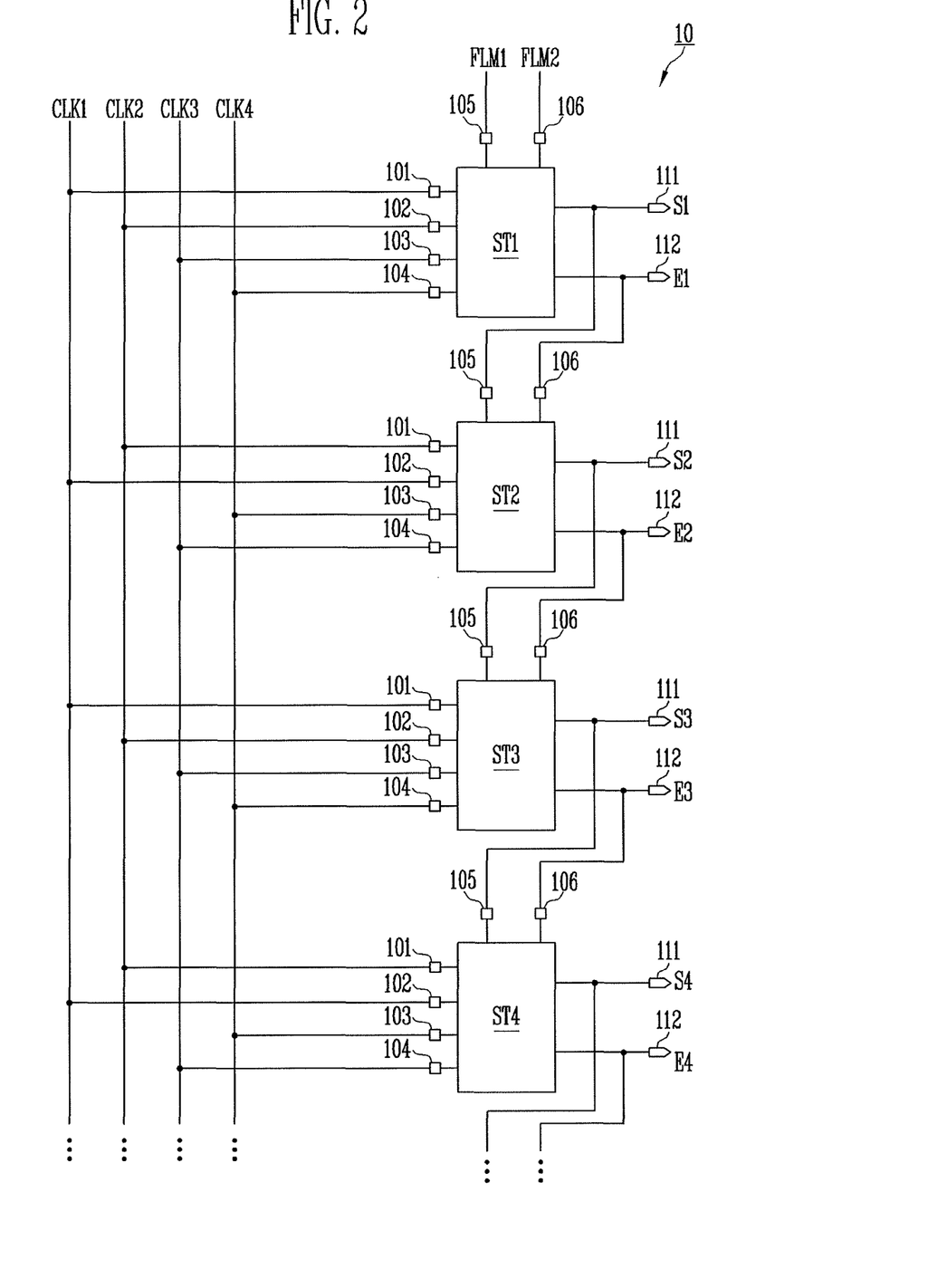
FIG. 2 illustrates an embodiment of a scan/emission driver.

FIG. 2 illustrates an embodiment of a scan/emission driver, which, for example, may be included in the one in FIG. 1. Referring to FIG. 2, scan/emission driver 10 includes a plurality of stages ST1 to ST4, each coupled to a scan line and an emission control line. The stages ST1 to ST4 may have a similar structure, but this is not necessary. Stages ST1 to ST4 progressively supply a scan signal to scan lines S1 to S4, and progressively supply an emission control signal to emission control lines E1 to E4.

Each stage ST1 to ST4 is driven by four clock signals CLK1, CLK2, CLK3 and CLK4, a first start signal FLM1 (or a scan signal of the previous stage), and a second start signal FLM2 (or an emission control signal of the previous stage). The first clock signal CLK1, second clock signal CLK2 and first start signal FLM1 (or the scan signal of the previous stage) are used to output a scan signal of the current stage. The third clock signal CLK3, fourth clock signal CLK4, and second start signal FLM2 (or the emission control signal of the previous stage) are used to output an emission control signal of the current stage.

Each stage ST1 to ST4 includes a first input terminal 101, a second input terminal 102, a third input terminal 103, a fourth input terminal 104, a fifth input terminal 105, a sixth input terminal 106, a first output terminal 111, and a second output terminal 112.

Figure 4:
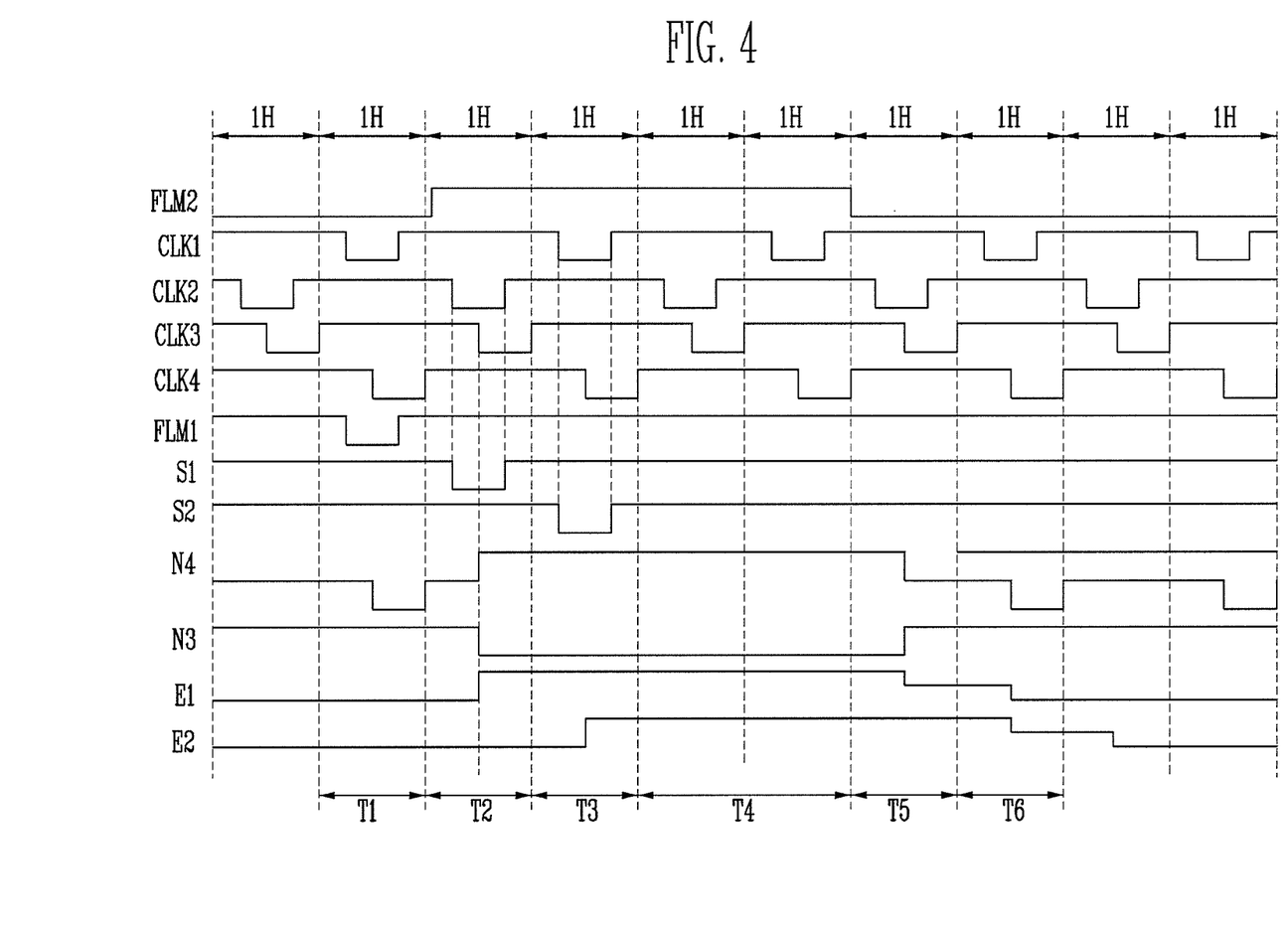
FIG. 4 illustrates an embodiment of a method for driving a stage circuit.

The first and second input terminals 101 and 102 included in an odd-numbered (or even-numbered) stage receive first and second clock signals CLK1 and CLK2, respectively. The first and second input terminals 101 and 102 in an even-numbered (or odd-numbered) stage receive second and first clock signals CLK2 and CLK1, respectively. In one embodiment, the first and second clock signals CLK1 and CLK2 may have the same period (as shown in FIG. 4), and the phases of the first and second clock signals CLK1 and CLK2 may be opposite to each other.

In one embodiment, each of the first and second clock signals CLK1 and CLK2 has a period of two horizontal periods (2H). A low signal (e.g., a low voltage) may be supplied during different horizontal periods of the first and second clock signals CLK1 and CLK2. Each of the first and second clock signals CLK1 and CLK2 may have a supply period of a high signal (e.g., a high voltage), set longer than that of the low signal (e.g., a low voltage). In this case, the high signals of the first and second clock signals CLK1 and CLK2 may overlap each other during at least a portion of a predetermined period.

The third and fourth input terminals 103 and 104 in an odd-numbered (or even-numbered) stage receive third and fourth clock signals CLK3 and CLK4, respectively. The third and fourth input terminals 103 and 104 in an even-numbered (or odd-numbered) stage receive fourth and third clock signals CLK4 and CLK3, respectively. The third and fourth clock signals CLK3 and CLK4 may have the same period, and the phases of the third and fourth clock signals CLK3 and CLK4 may be opposite.

For example, each of the third and fourth clock signals CLK3 and CLK4 has a period of two horizontal periods (2H). A low signal (low voltage) may be supplied during different horizontal periods of the third and fourth clock signals CLK3 and CLK4. Each of the third and fourth clock signals CLK3 and CLK4 has a supply period of the high signal (high voltage), which may be set longer than that of the low signal (low voltage). In this case, the high signals of the third and fourth clock signals CLK3 and CLK4 may overlap during a partial period. In addition, the low signal of the third clock signal CLK3 may overlap with that of the second clock signal CLK2 during at least a partial period. The low signal of the fourth clock signal CLK4 may overlap that of the first clock signal CLK1 during at least a partial period.

The fifth input terminal 105 in each of the stages ST1 to ST4 receives the first start signal FLM1 or the scan signal of the previous stage. For example, the fifth input terminal 105 in first stage ST1 may receive the first start signal FLM1. The fifth input terminal 105 in each of the other stages ST2 to ST4 may receive the scan signal of the previous stage.

The sixth input terminal 106 in each of the stages ST1 to ST4 receives the second start signal FLM2 or the emission control signal of the previous stage. For example, the sixth input terminal 106 in first stage ST1 may receive the second start signal FLM2. The sixth input terminal 106 included in each of the other stages ST2 to ST4 may receive the emission control signal of the previous stage.

First output terminal 111 of each of the stages ST1 to ST4 supplies a scan signal to a scan line S, and supplies an emission control signal to an emission control line E.

Figure 3:
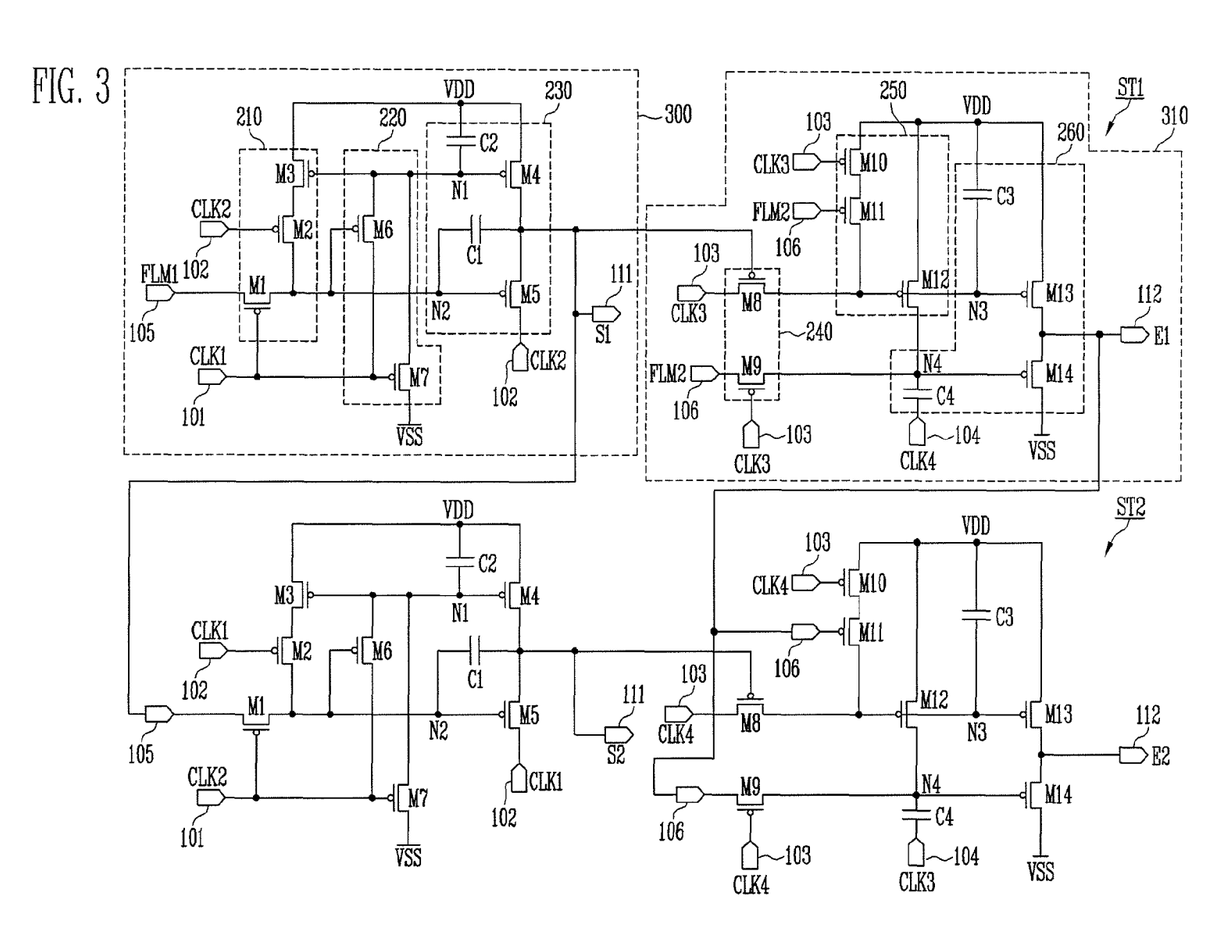
FIG. 3 illustrates an embodiment of the stage in FIG. 2.

FIG. 3 illustrates an embodiment of a stage in FIG. 2. For illustrative purposes only, first and second stages ST1 and ST2 are shown in FIG. 3, and the stage according to this embodiment will be described using the first stage ST1.

Referring to FIG. 3, stage ST1 includes a first supply unit 300 to supply a scan signal to the first output terminal 111, and a second supply unit 310 to supply an emission control signal to the second output terminal 112.

The first supply unit 300 outputs a scan signal to first scan line S1, corresponding to signals (or voltages) of the first, second, and fifth input terminals 101, 102, and 150. The first supply unit 300 includes a first driver 210, a second driver 220, and a first output unit 230.

The first output unit 230 controls a voltage supplied to the first output terminal 111, corresponding to voltages applied to first and second nodes N1 and N2. The first output unit 230 includes a fourth transistor M4, a fifth transistor M5, a first capacitor C1, and a second capacitor C2.

The fourth transistor M4 is coupled between a first power source VDD and first output terminal 111. A gate electrode of the fourth transistor M4 is coupled to the first node N1. The fourth transistor M4 controls the coupling between the first power source VDD and first output terminal 111, corresponding to the voltage applied to the first node N1. The first power source VDD may be set to a gate-off voltage, e.g., a high-level voltage.

The fifth transistor M5 is coupled between the first output terminal 111 and second input terminal 102. A gate electrode of the fifth transistor M5 is coupled to the second node N2. The fifth transistor M5 controls the coupling between the first output terminal 111 and second input terminal 102, corresponding to the voltage applied to the second node N2.

The first capacitor C1 is coupled between the second node N2 and first output terminal 111. The first capacitor C1 controls the voltage of the second node N2, corresponding to the voltage of the first output terminal 111.

The second capacitor C2 is coupled between the first node N1 and first power source VDD. The second capacitor C2 charges the voltage applied to the first node N1.

The first driver 210 controls the voltage of the second node N2, corresponding to signals supplied to the first, second, and fifth input terminals 101, 102, and 105. The first driver 210 includes a first transistor M1, a second transistor M2, and a third transistor M3.

The first transistor M1 is coupled between the fifth input terminal 105 and second node N2. A gate electrode of the first transistor M1 is coupled to the first input terminal 101. The first transistor M1 is turned on when the first clock signal CLK1 is supplied to the first input terminal 101, to allow the fifth input terminal 105 and the second node N2 to be electrically coupled to each other.

The second and third transistors M2 and M3 are coupled, in series, between the first power source VDD and second node N2. A gate electrode of the second transistor M2 is coupled to the second input terminal 102, and a gate electrode of the third transistor M3 is coupled to the first node N1. The second transistor M2 is turned on when the second clock signal CLK2 is supplied to the second input terminal 102. This allows the third transistor M3 and second node N2 to be electrically coupled to each other. The third transistor M3 controls the coupling between the second transistor M2 and first power source VDD, corresponding to the voltage of the first node N1.

The second driver 220 controls the voltage of the first node N1, corresponding to the voltages of the first input terminal 101 and second node N2. The second driver 220 includes a sixth transistor M6 and a seventh transistor M7.

The sixth transistor M6 is coupled between the first node N1 and the first input terminal 101. A gate electrode of the sixth transistor M6 is coupled to the second node N2. The sixth transistor M6 controls the coupling between the first node N1 and the first input terminal 101, corresponding to the voltage of the second node N2.

The seventh transistor M7 is coupled between the first node N1 and a second power source VSS. A gate electrode of the seventh transistor M7 is coupled to the first input terminal 101. The seventh transistor M7 is turned on when the first clock signal CLK1 is supplied to the first input terminal 101, to supply the voltage of the second power source VSS to the first node N1. The second power source VSS may be set to a gate-on voltage, e.g., a low-level voltage.

The second supply unit 310 outputs an emission control signal to the first emission control line E1, via the second output terminal 112, corresponding to signals (or voltages) of the first output terminal 111 and third, fourth, and sixth input terminals 103, 104, and 106. The second supply unit 310 includes a third driver 240, a fourth driver 250, and a second output unit 260.

The second output unit 260 controls a voltage supplied to the second output terminal 112, corresponding to voltages of third and fourth nodes N3 and N4. The second output unit 260 includes a thirteenth transistor m13, a fourteenth transistor M14, a third capacitor C3, and a fourth capacitor C4.

The thirteenth transistor M13 is coupled between the first power source VDD and second output terminal 112. A gate electrode of the thirteenth transistor M13 is coupled to the third node N3. The thirteenth transistor M13 controls the coupling between the first power source VDD and second output terminal 112, corresponding to the voltage of the third node N3.

The fourteenth transistor M14 is coupled between the second output terminal 112 and second power source VSS. A gate electrode of the fourteenth transistor M14 is coupled to the fourth node N4. The fourteenth transistor M14 controls the coupling between the second power source VSS and second output terminal 112, corresponding to the voltage of the fourth node N4.

The third capacitor C3 is coupled between the first power source VDD and the third node N3. The third capacitor C3 charges the voltage applied to the third node N3.

The fourth capacitor C4 is coupled between the fourth node N4 and the fourth input terminal 104. The fourth capacitor C4 controls the voltage of the fourth node N4, corresponding to the fourth clock signal CLK4 supplied to the fourth input terminal 104. Actually, the fourth capacitor C4 controls the voltage of the fourth node N4, so that the fourteenth transistor M14 can be completely turned on, based on the fourth clock signal CLK4 supplied to the fourth input terminal 104.

The third driver 240 controls the voltages of the third and fourth nodes N3 and N4, based on signals supplied to the first output terminal 111 and third and sixth input terminals 103 and 106.

The third driver 240 includes an eighth transistor M8 and a ninth transistor M9. The eighth transistor M8 is coupled between the third input terminal 103 and third node N3. A gate electrode of the eighth transistor M8 is coupled to the first output terminal 111. The eighth transistor M8 is turned on when the scan signal is supplied to the first output terminal 111, to allow the third input terminal 103 and third node N3 to be electrically coupled to each other.

The ninth transistor M9 is coupled between the sixth input terminal 106 and fourth node N4. A gate electrode of the ninth transistor M9 is coupled to the third input terminal 103. The ninth transistor M9 is turned on when the third clock signal CLK3 is supplied to the third input terminal 103, to allow the sixth input terminal 106 and the fourth node N4 to be electrically coupled to each other.

The fourth driver 250 controls the voltage of the third node N3 corresponding to signals supplied to the third and sixth input terminals 103 and 106, and controls the voltage of the fourth node N4 corresponding to the voltage of the third node N3. The fourth driver 250 includes a tenth transistor M10, an eleventh transistor M11, and a twelfth transistor M12.

The tenth and eleventh transistors M10 and M11 are coupled in series between the first power source VDD and third node N3. A gate electrode of the tenth transistor M10 is coupled to the third input terminal 103. A gate electrode of the eleventh transistor M11 is coupled to the sixth input terminal 106. The tenth transistor M10 is turned on when the third clock signal CLK3 is supplied, to allow the first power source VDD and eleventh transistor M11 to be electrically coupled to each other. The eleventh transistor M11 is turned off when the second start signal FLM2 is supplied to the sixth input terminal 106, and is turned on otherwise to allow the tenth transistor M10 and the third node N3 to be electrically coupled to each other.

The twelfth transistor M12 is coupled between the first power source VDD and the fourth node N4. A gate electrode of the twelfth transistor M12 is coupled to the third node N3. The twelfth transistor M12 controls the electrical coupling between the first power source VDD and the fourth node N4 based on the voltage of third node N3.

FIG. 4 illustrates an embodiment of a method for driving method of the stage circuit in FIG. 3. For illustrative purposes, the method is described for first stage ST1.

Referring to FIG. 4, first and second clock signals CLK1 and CLK2 have the same period, and the low signals of the first and second clock signals CLK1 and CLK2 are supplied in different horizontal periods. The third and fourth clock signals CLK3 and CLK4 have the same period, and the low signals of the third and fourth clock signals CLK3 and CLK4 are supplied in different horizontal periods. The low signals of the second and third clock signals CLK2 and CLK3 overlap each other during at least a partial period. The low signals of the first and fourth clock signals CLK1 and CLK4 overlap each other during at least a partial period.

The first start signal FLM1 is supplied to the fifth input terminal 105 and is to be synchronized with the clock signal CLK1 supplied to the first input terminal 101. The second start signal FLM2 is supplied to the sixth input terminal 106 and overlaps the low signal of the clock signal CLK3 supplied to the third input terminal 103 one or more times.

In the present embodiment, supply of the first start signal FLM1 corresponds to the case where a gate-on voltage (e.g., low voltage) is supplied to turn on a transistor. Supply of the second start signal FLM2 corresponds to the case where a gate-off voltage (e.g., high voltage) is supplied to turn off a transistor. Additionally, supply of the first to fourth clock signals CLK1 to CLK4 corresponds to the case where a gate-on voltage (e.g., the low voltage) is supplied to turn on a transistor. For the sake of illustration, the process of supplying the scan signal will be described, and the process of supplying the emission control signal will then be described.

During a first period T1, the first clock signal CLK1 is supplied to the first input terminal 101 and the first start signal FLM1 is supplied to the fifth input terminal. When the first clock signal CLK1 is supplied to the first input terminal 101, first and seventh transistors M1 and M7 turn on.

When first transistor M1 turns on, first start signal FLM1 from the fifth input terminal 105 is supplied to the second node N2. In this case, the second node N2 is set to the low voltage. Accordingly, fifth and sixth transistors M5 and M6 turn on.

When fifth transistor M5 turns on, the second input terminal 102 and first output terminal 111 are electrically coupled to each other. The second clock signal CLK2 is not supplied during the first period T1. Hence, second input terminal 102 maintains the high voltage. Accordingly, the high voltage is output to the first output terminal 111.

When sixth transistor M6 turns on, first clock signal CLK1 from the first input terminal 101 is supplied to the first node N1. In this case, the first node N1 is set to the low voltage. Accordingly, third and fourth transistors M3 and M4 turn on. When fourth transistor M4 turns on, the voltage of the first power source VDD is supplied to the first output terminal 111. The voltage of the first power source VDD is set to a voltage equal (or similar) to the high voltage from the second input terminal 102. Accordingly, the first output terminal 111 stably maintains the high voltage.

When third transistor M3 turns on, the second transistor m2 and first power source VDD are electrically coupled to each other. Here, the second transistor M2 maintains the turn-off state during the first period T1. Hence, the second node N2 maintains the low voltage regardless of the turn-on state of third transistor M3.

When seventh transistor M7 turns on, the voltage of the second power source VSS is supplied to the first node N1. Here, the voltage of the second power source VSS is set to a voltage equal (or similar) to the first clock signal CLK1. Accordingly, the first node N1 stably maintains the low voltage.

During a second period T2, supply of the first start signal FLM1 and first clock signal CLK1 is stopped, Also, the second clock signal CLK2 is supplied to the second input terminal 102.

When supply of the first clock signal CLK1 is stopped, first and seventh transistors M1 and M7 turn off. In this case, the second node N2 maintains the low voltage based on the voltage stored in first capacitor C1. Accordingly, fifth and sixth transistors M5 and M6 maintain the turn-on state.

When sixth transistor M6 maintains the turn-on state, the high voltage from first input terminal 101 is supplied to the first node N1. When the high voltage is supplied to the first node N1, third and fourth transistors M3 and M4 are turned off.

When fifth transistor M5 maintains the turn-on state, the second clock signal CLK2 from second input terminal 102 is supplied to the first output terminal 111. In this case, the voltage of the second node N2 is additionally dropped by coupling of the first capacitor C1. Accordingly, fifth transistor M5 stably maintains the turn-on state. The second clock signal CLK2 supplied to the first output terminal 111 is output as the scan signal to the first scan line S1. In addition, the second clock signal CLK2 is supplied to the fifth input terminal 105 of the next stage ST2.

When the second clock signal CLK2 is additionally supplied to the second input terminal 102, the third transistor M3 and second node N2 are electrically coupled to each other. In this case, third transistor M3 is set to the turn-off state. Hence, the second node N2 stably maintains the low voltage.

During a third period T3, first clock signal CLK1 is supplied to the first input terminal 101. Accordingly, first and seventh transistors M1 and M7 are turned on. When first transistor M1 is turned on, the high voltage from the fifth input terminal 105 is supplied to the second node N2. Accordingly, fifth and sixth transistors M5 and M6 are turned off.

When seventh transistor M7 turns on, the voltage of the second power source VSS is supplied to the first node N1. As a result, third and fourth transistors M3 and M4 turn on. When fourth transistor M4 is turned on, the voltage of the first power source VDD is supplied to the first output terminal 111.

Subsequently, fourth and third transistors M4 and M3 maintain the turn-on state based on the voltage charged in second capacitor C2. Accordingly, the first output terminal 104 outputs the voltage of the first power source VDD. Additionally, when second transistor M2 turns on when the second clock signal CLK2 is supplied, the voltage of the first power source VDD is supplied to the second node N2. Accordingly, fifth and sixth transistors M5 and M6 stably maintain the turn-off state.

The second stage ST2 receives the scan signal of the first stage ST1 through the fifth input terminal 105, to be synchronized with the second clock signal CLK2 supplied to the first input terminal 101. In this case, the second stage ST2 outputs the first clock signal CLK1 as the scan signal to the second scan line S2. The first supply units 300 may progressively output the scan signal to the scan lines S1 to Sn by repeating the aforementioned process.

The process of outputting the emission control signal from the second supply unit 310 may be as follows. Initially, the scan signal is output to the first output terminal 111 during the second period. The third clock signal CLK3 is supplied to the third input terminal 103 and overlaps the scan signal during at least a partial period. The second start signal FLM2 is supplied to the sixth input terminal 106 and overlaps the third clock signal CLK3.

When the scan signal is supplied to the first output terminal 111, the eighth transistor M8 turns on. When eighth transistor M8 turns on, the third clock signal CLK3 from the third input terminal 103 is supplied to the third node N3. When the third clock signal CLK3 (e.g., a low voltage) is supplied to the third node N3, twelfth and thirteenth transistors M12 and M13 turn on.

When twelfth transistor M12 turns on, the voltage of the first power source VDD is supplied to the fourth node N4. When the voltage of the first power source VDD is supplied to the fourth node N4, fourteenth transistor M14 turns off. When the thirteenth transistor M13 turns on, the voltage of the first power source VDD is supplied to the second output terminal 112. The voltage of the first power source VDD, supplied to the second output terminal 112, is supplied as the emission control signal to the first emission control line E1. In addition, the voltage of the first power source VDD is supplied to the sixth input terminal 106 of the next stage.

Additionally, ninth and tenth transistors M9 and M10 turn on by the third clock signal CLK3 supplied to the third input terminal 103 during the second period T2. When ninth transistor M9 turns on, the second start signal FLM2 is supplied to the fourth node N4. The second start signal FLM2 may be set to a voltage equal (or similar) to that of the first power source VDD. Accordingly, the fourth node N4 stably maintains the high voltage.

When tenth transistor M10 turns on, the first power source VDD and eleventh transistor M11 are electrically coupled to each other. In this case, eleventh transistor M11 is set to the turn-off state based on the second start signal FLM2 supplied to the sixth input terminal 106. Hence, the third node N3 stably maintains the low voltage.

Subsequently, supply of the second start signal FLM2 to the sixth input terminal 106 is maintained during the third period T3 and a fourth period T4. Thus, eleventh transistor M11 is set to the turn-off state during the third and fourth periods T3 and T4. When the eleventh transistor M11 is set to the turn-off state, the third node N3 maintains the low voltage. Accordingly, twelfth and thirteenth transistors M12 and M13 maintain the turn-on state.

When twelfth transistor M12 maintains the turn-on state, the voltage of the first power source VDD is supplied to the fourth node N4 during the third and fourth periods T3 and T4. Accordingly, fourteenth transistor M14 is set to the turn-off state. When the thirteenth transistor M13 maintains the turn-on state, the voltage of the first power source VDD is output to the second output terminal 112. That is, the emission control signal is output to the second output terminal 112 during the period in which the second start signal FLM2 is supplied.

Supply of the second start signal FLM2 to the sixth input terminal 106 is stopped during a fifth period T5. The third clock signal CLK3 is supplied to the third input terminal 103. When supply of the second start signal FLM2 to the sixth input terminal 106 is stopped, eleventh transistor M11 turns on.

When the third clock signal CLK3 is supplied to the third input terminal 103, ninth and tenth transistors M9 and M10 turn on. When ninth transistor M9 turns on, the sixth input terminal 106 and the fourth node N4 are electrically coupled to each other. Accordingly, the low voltage is supplied to the fourth node N4. When the low voltage is supplied to the fourth node N4, fourteenth transistor M14 turns on. When fourteenth transistor M14 turns on, the voltage of the second power source VSS (e.g., a voltage higher by Vth of the fourteenth transistor M14 than that of the second power source VSS) is supplied to the second output terminal 112. That is, output of the emission control signal is stopped during the fifth period T5.

When tenth transistor M10 turns on, the voltage of the first power source VDD is supplied to the third node N3 via tenth and eleventh transistors M10 and M11. When the voltage of the first power source VDD is supplied to the third node N3, twelfth and thirteenth transistors M12 and M13 turn off.

The fourth clock signal CLK4 is supplied to the fourth input terminal 104 during a sixth period T6. When the fourth clock signal CLK4 is supplied to the fourth input terminal 104, the voltage of the fourth node N4 (set to a floating state) is additionally dropped. Accordingly, fourteenth transistor M14 is completely turned on. When fourteenth transistor M14 is completely turned on, the voltage of the second output terminal 112 is dropped to the voltage of the second power source VSS.

The second stage ST2 receives the emission control signal of the first stage ST1 through the sixth input terminal 106. Then, the second stage ST2 outputs the voltage of the first power source VDD as the emission control signal to the second emission control line E2, based on the width of the emission control signal supplied from the first stage ST1. In one embodiment, the second supply units 310 progressively outputs the emission control signal to the emission control lines E1 to En by repeating the aforementioned process.

Figure 5:
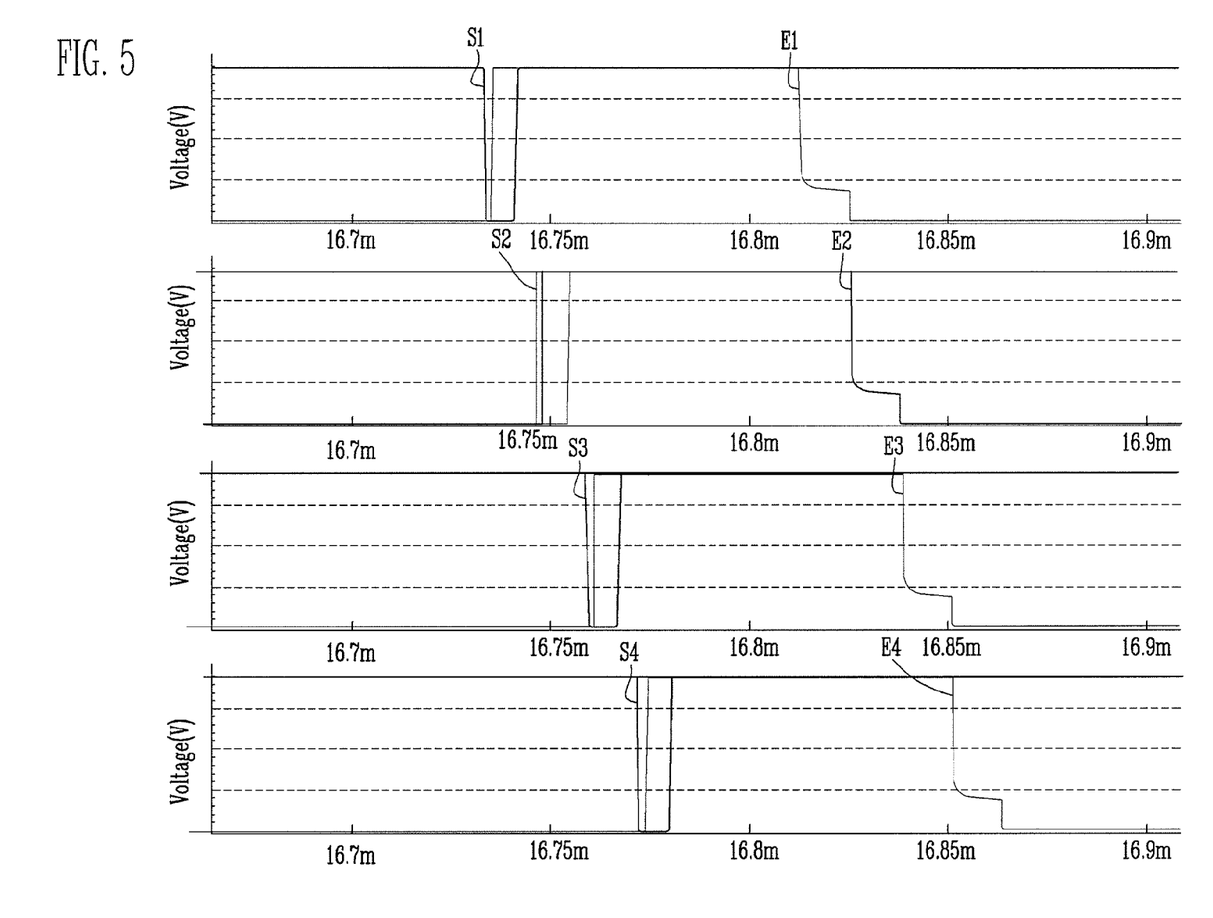
FIG. 5 illustrates a simulation result of the scan driver.

FIG. 5 illustrates an example of a simulation result for the scan driver. In FIG. 5, the scan signal is progressively output to scan lines S1 to S4, and the emission control signal is progressively output to the emission control lines E1 to En. That is, the scan driver stably outputs the scan signal and emission control signal using one stage.

Figure 6:
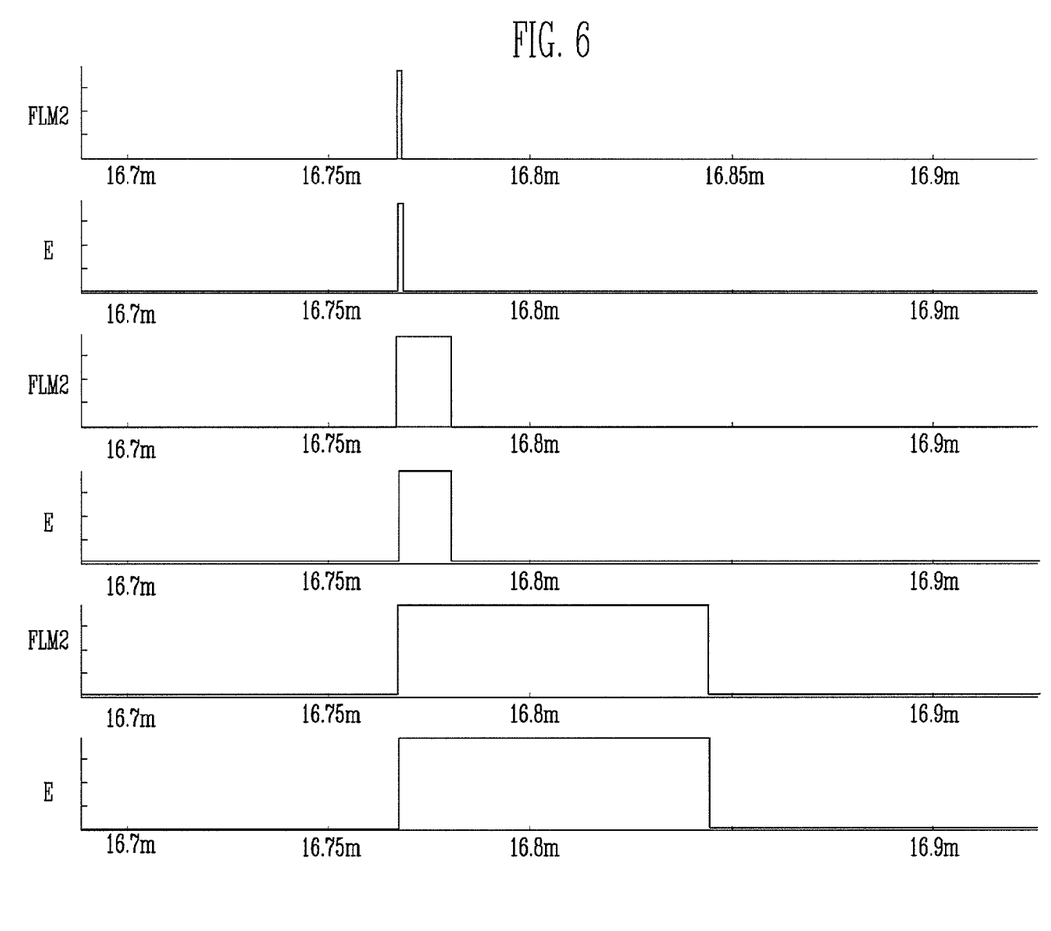
FIG. 6 illustrates a simulation result of based on an emission control signal.

FIG. 6 illustrates an example of a simulation result of the emission control signal corresponding to the second start signal. In FIG. 6, the stage outputs the emission control signal based on the width of second start signal FLM2. When the width of the second start signal FLM2 is relatively wide, the width of the emission control signal is also wide. When the width of the second start signal FLM2 is relatively narrow, the width of the emission control signal is also narrow. In this embodiment, the width of the emission control signal is therefore controlled based on the width of the second start signal FLM2.

The foregoing embodiments have been described for PMOS transistors. In other embodiments, NMOS transistors may be used.

By way of summation and review, an organic light emitting display device includes a data driver to supply data signals to data lines, a scan driver to progressively supply a scan signal to scan lines, an emission control driver to progressively supply an emission control signal to emission control lines, and a pixel unit having a plurality of pixels coupled to the scan and data lines.

Pixels in the pixel unit are selected when a scan signal is supplied to a scan line, in order to receive a data signal from a data line. The pixels generate light with a luminance corresponding to the data signal, to thereby display an image. The pixels are set to a non-emission state based on an emission control signal from an emission control line during a period in which the data signal is charged.

The scan driver includes stages respectively coupled to the scan lines. The emission control driver includes stages respectively coupled to the emission control lines. Each stage includes a plurality of transistors and a plurality of capacitors. In accordance with one or more embodiments, the scan and emission control signals are generated using one stage, thereby minimizing a mounting area for the control circuits of the display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A stage circuit, comprising:
a first supply circuit coupled to first, second, and fifth input terminals, the first supply circuit to output a scan signal to a first output terminal; and
a second supply circuit coupled to the first output terminal and third, fourth, and sixth input terminals, the second supply circuit to output an emission control signal to a second output terminal, wherein the second supply circuit includes:
a first transistor between a first power source and the second output terminal, the first transistor having a gate electrode coupled to a first node;
a second transistor between the second output terminal and a second power source, the second transistor having a gate electrode coupled to a second node; and
third and fourth transistors coupled in series between the first power source and the first node, wherein:
a gate electrode of the third transistor is coupled to the third input terminal, and a gate electrode of the fourth transistor is coupled to the sixth input terminal, and wherein
first, second, third, and fourth clock signals are respectively supplied to the first, second, third, and fourth input terminals.

2. The stage circuit as claimed in claim 1, wherein:
the first power source is set to a gate-off voltage, and
the second power source is set to a gate-on voltage.

3. The stage circuit as claimed in claim 1, wherein:
a first start signal or a scan signal of a previous stage is supplied to the fifth input terminal, and
a second start signal or an emission control signal of the previous stage is supplied to the sixth input terminal.

4. The stage circuit as claimed in claim 3, wherein:
the first and second clock signals have substantially a same period, and
voltages corresponding to low signals of the first and second clock signals do not overlap.

5. The stage circuit as claimed in claim 4, wherein:
the third and fourth clock signals have substantially a same period, and
voltages corresponding to low signals of the third and fourth clock signals do not overlap.

6. The stage circuit as claimed in claim 5, wherein the low signals of the first and fourth clock signals overlap during at least part of a period.

7. The stage circuit as claimed in claim 5, wherein the low signals of the second and third clock signals overlap during at least part of a period.

8. The stage circuit as claimed in claim 1, wherein the second supply circuit includes a first capacitor coupled between the second node and the fourth input terminal.

9. The stage circuit as claimed in claim 8, wherein the second supply circuit includes:
a fifth transistor coupled between the third input terminal and the first node, the fifth transistor having a gate electrode coupled to the first output terminal;
a sixth transistor coupled between the sixth input terminal and the second node, the sixth transistor having a gate electrode coupled to the third input terminal;
a seventh transistor coupled between the first power source and the second node, the seventh transistor having a gate electrode coupled to the first node; and
a second capacitor coupled between the first power source and the first node.

10. The stage circuit as claimed in claim 1, wherein the first supply circuit includes:
a fifth transistor coupled between the fifth input terminal and a third node, the first transistor having a gate electrode coupled to the first input terminal;
a sixth transistor coupled between the first power source and the third node, the sixth transistor having a gate electrode coupled to the second input terminal;
a seventh transistor coupled between the sixth transistor and the first power source, the seventh transistor having a gate electrode coupled to a fourth node;
an eighth transistor coupled between the first power source and the first output terminal, the eighth transistor having a gate electrode coupled to the fourth node;
a ninth transistor coupled between the first output terminal and the second input terminal, the ninth transistor having a gate electrode coupled to the third node;
a tenth transistor coupled between the fourth node and the first input terminal, the tenth transistor having a gate electrode coupled to the third node;
an eleventh transistor coupled between the fourth node and the second power source, the eleventh transistor having a gate electrode coupled to the first input terminal;
a first capacitor coupled between the first output terminal and the third node; and
a second capacitor coupled between the first power source and the fourth node.

11. An organic light emitting display device, comprising:
a plurality of pixels in an area defined by scan lines, data lines, and emission control lines; and
a driver which include a number of stages to supply a scan signal to the scan lines and an emission control signal to the emission control lines, wherein each of the number of stages includes:
a first supply circuit coupled to first, second, and fifth input terminals, the first supply circuit to output a scan signal to a first output terminal; and
a second supply circuit coupled to the first output terminal and third, fourth, and sixth input terminals, the second supply circuit to output an emission control signal to a second output terminal, wherein the second supply circuit includes:
a first transistor between a first power source and the second output terminal, the first transistor having a gate electrode coupled to a first node;
a second transistor between the second output terminal and a second power source, the second transistor having a gate electrode coupled to a second node; and
third and fourth transistors coupled in series between the first power source and the first node, wherein:
a gate electrode of the third transistor is coupled to the third input terminal, and a gate electrode of the fourth transistor is coupled to the sixth input terminal, and wherein
first, second, third, and fourth clock signals are respectively supplied to the first, second, third, and fourth input terminals.

12. The display device as claimed in claim 11, wherein:
the first power source is set to a gate-off voltage, and
the second power source is set to a gate-on voltage.

13. The display device as claimed in claim 11, wherein:
the first, second, third, and fourth clock signals are respectively supplied to the first, second, third and fourth input terminals of an odd-numbered stage, and
the second, first, fourth, and third clock signals are respectively supplied to the first, second, third, and fourth input terminals of an even-numbered stage.

14. The display device as claimed in claim 13, wherein:
the first and second clock signals have substantially a same period, and
voltages corresponding to low signals of the first and second clock signals do not overlap.

15. The display device as claimed in claim 14, wherein:
the third and fourth clock signals have substantially a same period, and
voltages corresponding to low signals of the third and fourth clock signals do not overlap.

16. The display device as claimed in claim 15, wherein the low signals of the first and fourth clock signals overlap during at least part of a period.

17. The display device as claimed in claim 15, wherein the low signals of the second and third clock signals overlap during at least part of a period.

18. The display device as claimed in claim 11, wherein:
a first start signal set to a gate-on voltage or a scan signal of a previous stage is supplied to the fifth input terminal, and
a second start signal set to a gate-off voltage or an emission control signal of the previous stage is supplied to the sixth input terminal.

19. The display device as claimed in claim 18, wherein:
the first start signal or the scan signal of the previous stage, supplied to the fifth input terminal, overlaps a clock signal supplied to the first input terminal, and
the second start signal or the emission control signal of the previous stage, supplied to the sixth input terminal, overlaps a clock signal supplied to the third input terminal one or more times.

20. The display device as claimed in claim 11, wherein the second supply circuit includes:
a fifth transistor coupled between the third input terminal and the first node, the fifth transistor having a gate electrode coupled to the first output terminal;
a sixth transistor coupled between the sixth input terminal and the second node, the sixth transistor having a gate electrode coupled to the third input terminal;
a seventh transistor coupled between the first power source and the second node, the seventh transistor having a gate electrode coupled to the first node;
a first capacitor coupled between the first power source and the first node; and
a second capacitor coupled between the second node and the fourth input terminal.

* * * * *